(12) United States Patent
Raju et al.

(10) Patent No.: US 11,967,397 B2
(45) Date of Patent: Apr. 23, 2024

(54) COMMUNICATION SYSTEM WITH MIXED THRESHOLD VOLTAGE TRANSISTORS

(71) Applicant: Texas Instruments Incorporated, Dallas, TX (US)

(72) Inventors: Veeramanikandan Raju, Bangalore (IN); Anand Kumar G, Bengaluru (IN)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 17/710,879

(22) Filed: Mar. 31, 2022

(65) Prior Publication Data

US 2023/0317123 A1   Oct. 5, 2023

(51) Int. Cl.
*G11C 7/10* (2006.01)
*G11C 5/14* (2006.01)
*G11C 7/22* (2006.01)

(52) U.S. Cl.
CPC ............... *G11C 7/109* (2013.01); *G11C 5/14* (2013.01); *G11C 7/1039* (2013.01); *G11C 7/1063* (2013.01); *G11C 7/222* (2013.01)

(58) Field of Classification Search
CPC ..... G11C 7/109; G11C 7/1039; G11C 7/1063; G11C 7/222; G11C 5/14
See application file for complete search history.

(56) References Cited

U.S. PATENT DOCUMENTS

2014/0281220 A1* 9/2014 Noguchi ............... G06F 3/0689
711/114
2018/0190360 A1* 7/2018 Seo ........................ H02M 3/07

FOREIGN PATENT DOCUMENTS

EP          0682308 A1 *  11/1995

OTHER PUBLICATIONS

Digital Operation Unit; (Year: 1995).*

* cited by examiner

*Primary Examiner* — Sultana Begum
(74) *Attorney, Agent, or Firm* — Michael T. Gabrik; Frank D. Cimino

(57) ABSTRACT

A communications circuit with an input port, a switching circuit coupled to the input port, and a first and second memory coupled to the switching circuit. The communications circuit also includes controlling circuitry adapted to operate the switching circuit to couple data received at the input port to the first memory while the second memory is disabled from power and to couple data received at the input port to the second memory once the first memory is filled with valid data.

15 Claims, 3 Drawing Sheets

US 11,967,397 B2

COMMUNICATION SYSTEM WITH MIXED THRESHOLD VOLTAGE TRANSISTORS

CROSS-REFERENCE TO RELATED APPLICATION

Not applicable.

BACKGROUND

The described examples relate to electronic circuits and more particularly to a communication system with improved performance.

Serial data may be communicated by various different types of communication modules/protocols, including as examples, serial peripheral interface (SPI), universal asynchronous receiver-transmitter (UART), I2C (inter-integrated circuit), controller area network flexible data-rate (CAN-FD) module, universal serial bus (USB), and quad serial peripheral interface (QSPI). These serial communication modules often have various performance requirements, including operational frequency and power usage, the latter of which is affected by device (typically transistor) current leakage. Further, frequency and power usage represent a performance tradeoff, in that higher frequency is typically achieved with transistors that tend to leak higher amounts of current, thereby consuming a greater amount of power, while lower frequency and lower leakage devices tend to be larger and consume more area.

For more recent and contemporary integrated circuit (IC) implementations, some entire communication or computational systems are formed with a single IC, sometimes referred to as a system on a chip (SoC). The SoC may have power specifications, some of which are relatively low. Accordingly, to the extent the SoC includes one or more communication peripherals, the low-power SoC requirements are applied also to the included communication peripheral(s). With the conflicting requirements noted earlier, however, satisfying a SoC low-power requirement is a challenge if the SoC includes a communication peripheral that is to operate at a relatively higher frequency. One prior art approach includes multiple power domains (and sometimes corresponding voltage rails) in the same SoC, for example a first power domain with a relatively larger amount of current leakage, typically due to faster but higher leakage transistors with lower threshold voltages and a second power domain with a relatively lesser amount of current leakage, typically due to slower but lower leakage transistors with higher threshold voltages, where either domain may have some other name that suggests its magnitude relative to one or more other domains on the same SoC. In this case, a first set of one or more communication peripherals may be implemented in the first power domain, and a second set of one or more communication peripherals may be implemented in the second power domain, each achieving the goals, but also incurring the restrictions, provided by the respective power domain. Further, in some prior art implementations, a same type of communication peripheral may be implemented twice, as a first instance in the first power domain and as a second instance in the second power domain. In this manner, a selected instance of the peripheral can be chosen for the respective performance provided, in either domain, but this comes at the cost of duplicating the peripheral in both power domains.

Examples are provided in this document that may improve on various of the above considerations as well as other concepts, as further detailed below.

SUMMARY

In one example, there is a communications circuit with an input port, a switching circuit coupled to the input port, and a first and second memory coupled to the switching circuit. The communications circuit also includes controlling circuitry adapted to operate the switching circuit to couple data received at the input port to the first memory while the second memory is disabled from power and to couple data received at the input port to the second memory once the first memory stores a predetermined amount of valid data.

In another example, there is a communications circuit with an input port and a logical memory. The logical memory includes a first memory portion, including at least one M-bit storage location that includes transistors having a first threshold voltage and a second memory portion, including at least one M-bit storage location that includes transistors having a second threshold voltage lower than the first threshold voltage. The communications circuit also includes data switching circuitry coupled between the input port and the logical memory.

In another example, there is a method of operating a communications device, including receiving a data sequence at an input port, and for a first portion of the data sequence, coupling the first portion to a first memory of the communications device while disabling power from a second memory of the communications device, and for a second portion of the data sequence, coupling the second portion to the second memory while enabling power to the second memory.

Other aspects are also disclosed and claimed.

DETAILED DESCRIPTION

Figure 1:
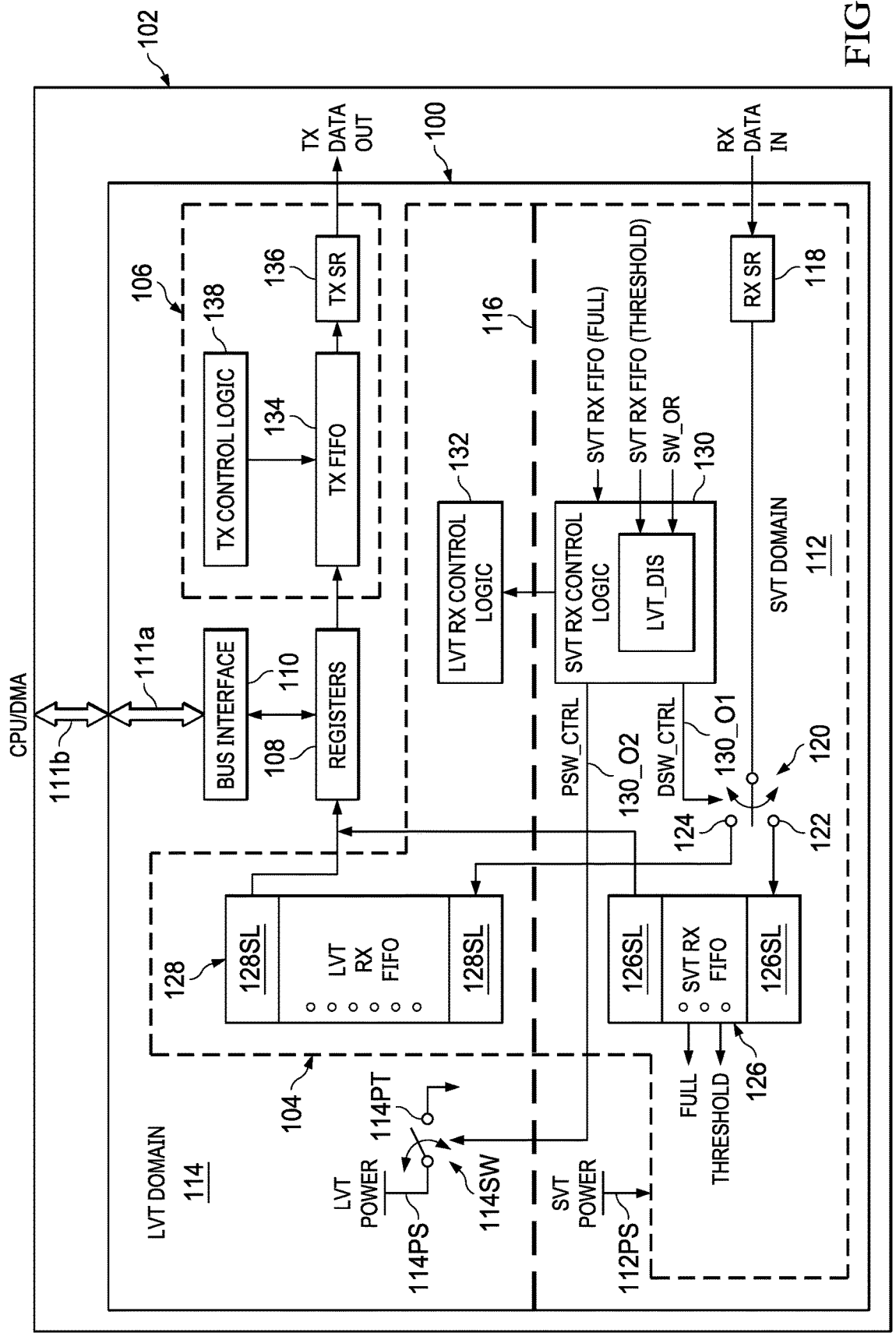
FIG. 1 is an example of a serial communication module (SCM) as may be implemented as part of a transceiver in an integrated circuit.

FIG. 1 is an example of a serial communication module (SCM) 100, as may be implemented as part of a transceiver in an integrated circuit (IC) 102. The IC 102 may include multiple instances of the SCM 100, but for brevity only one is shown and discussed with respect to FIG. 1. The SCM 100 may be implemented in various forms, for example in connection with SPI, UART, I2C, CAN-FD, USB, or QSPI, although specific circuitry or programming with respect to a particular one of those, as compared to any of the others, is not shown, but should be understood to be included within the IC 102 and may be adapted to the other teachings that are illustrated and described. For general reference, the SCM 100 is shown to include a receive (RX) section 104 and a transmit (TX) section 106. Both the RX section 104 and the TX section 106 communicate with a block of registers 108, which is bidirectionally coupled to a bus interface (I/F) 110. The bus I/F 110 communicates bidirectionally via a first bus 111*a* to other circuits on the IC 102 (not shown) that are coupled to the first bus 111a, or further through a second bus 111b that communicates external to the SCM 100 (e.g., via a pin or the like), for example to a central processing unit (CPU) or a direct memory access (DMA) controller. Accordingly, serial RX DATA IN received in the RX section 104 ultimately may be communicated to the bus I/F 110, and information may be provided from the bus I/F 110 for transmission out as serial TX DATA OUT.

The SCM 100 includes at least two power domains, namely, a first relatively low power SVT DOMAIN 112, for example using high threshold voltage transistors, and a second relatively high power LVT DOMAIN 114, for example using low threshold voltage transistors. While the terms SVT and LVT are used to distinguish SVT DOMAIN 112 from LVT DOMAIN 114, transistor threshold voltage is merely one example of a device parameter that may be leveraged to create a relatively low power domain (of which SVT DOMAIN 112 is an example) and a relatively higher power domain (of which LVT DOMAIN 114 is an example). Any other suitable device parameter(s) may be used to create the different power DOMAINS 112 and 114. FIG. 1 illustrates the DOMAINS 112 and 114 separated by a (horizontal dashed) domain dividing line 116. Accordingly, blocks below the domain dividing line 116 are constructed using technologies, and are for operating, within a relatively low power environment (tending toward lower power consumption), while blocks above domain dividing line 116 are constructed using technologies, and are for operating, within a relatively high power environment (tending toward higher power consumption). The SVT DOMAIN 112 includes an SVT power supply 112PS that is always on, when the SCM 100 is itself powered (or not resetting). The LVT DOMAIN 114 has a switched LVT power supply 114PS, which is selectively enabled and disabled at different times, as shown by operation of a supply switch 114SW between an LVT power source and a power terminal 114PT, so that when the supply switch 114SW is closed, power is provided via the terminal 114PT to devices in the LVT DOMAIN 114, while when the supply switch 114SW is opened, power is disabled from the LVT DOMAIN 114 and accordingly saved, as further detailed later. The domain dividing line 116 represents generally the separation of power leakage levels, but also may represent different physical regions on the SCM 100, as typically each different domain is implemented using different types of transistors, which may be physically separated or isolated on the SCM 100 for example due to fabrication constraints or preferences. Accordingly, the SVT DOMAIN 112 can be implemented with relatively low-leakage (higher threshold voltage), and sometimes larger, transistors, while the LVT DOMAIN 114 can be implemented with relatively small, faster-switching, yet higher leakage (lower threshold voltage) transistors. Further in the illustrated example and as detailed below, the RX section 104 includes portions in both the SVT DOMAIN 112 and the LVT DOMAIN 114, while the TX section 106 is solely within the LVT DOMAIN 114.

The RX section 104 includes various aspects for receiving the RX DATA IN data sequence. Looking from right to left in FIG. 1 at the RX section 104, an M-bit RX serial register (SR) 118 receives the RX DATA IN sequence from a source external from the SCM 100, for example one bit at a time, and thereby provides a serial input port to the SCM 100, and where for example, M=16. The RX SR 118 shifts and outputs a set of received bits to a pole of a data switch 120, and the data switch 120 has a throw that can selectively couple its pole to either a first terminal 122 or a second terminal 124. The first terminal 122 is coupled as an input to an SVT RX first in first out memory (FIFO) 126, which has at least its storage locations 126SL located in the SVT DOMAIN 112, and the second terminal 124 is coupled as an input to an LVT RX FIFO 128, which has at least its storage locations 128SL located in the LVT DOMAIN 114. As further detailed below, together the SVT RX FIFO 126 and the LVT RX FIFO 128 operate, from a software perspective, as a single logical receive FIFO. Relatedly, each of the SVT RX FIFO 126 and the LVT RX FIFO 128 includes one or more of the same sized storage locations 126SL or 128SL, for example with each storage location providing an M-bit storage, where the SVT RX FIFO 126 has fewer storage locations than the LVT RX FIFO 128, with a ratio of storage between the two FIFOs 126 and 128 as 1:R, with, for example, 8≤R≤64, for reasons discussed later. Data is written to, and then successively output from, the two FIFOs 126 and 128 as a single logical FIFO generally in a FIFO manner, and per pointers not expressly shown, for example pointing to the newest and oldest data locations in the combined logical FIFO that includes the two FIFOs 126 and 128. The SVT RX FIFO 126 also outputs two control signals: (i) THRESHOLD, which is asserted when the SVT RX FIFO 126 is a percentage of full, and where the particular percentage or other manner of indicating the limit may be software configurable, and where the percentage can be, for example, in a range from 25% to 75%; and (ii) a storage level greater than that for THRESHOLD, for example as FULL, which is asserted when all storage locations in the SVT RX FIFO 126 store valid data. Each of the SVT RX FIFO 126 and the LVT RX FIFO 128 has a respective output connected to an input of the block of registers 108, for example for passing such data through the bus I/F 110 to either the CPU or a DMA controller.

The SCM 100 also includes structures associated with control in the RX section 104, while not in the direct data path that communicates input/output data of the SCM 100. Specifically, an SVT RX control logic block 130 is associated with the RX section 104 and is within the SVT DOMAIN 112, for controlling certain operations in connection with the SVT RX FIFO 126. Particularly, the SVT RX control logic block 130 has a first output 130_01 and a second output 130_02. The first output 130_01 provides a control signal DSW_CTRL, the state of which controls the data switch 120 to couple data received at its pole to either the first terminal 122 or the second terminal 124. The second output 130_02 provides a control signal PSW_CTRL, the state of which controls the supply switch 114SW to selectively enable or disable the switched LVT power supply 114PS, thereby respectively enabling or disabling power to the LVT DOMAIN 114. As detailed later, the SVT RX control logic block 130 asserts/de-asserts these control signals in response to one or more inputs, those including the FULL signal and the THRESHOLD signal from the SVT RX FIFO 126, and what is shown in the SVT RX control logic block 130 as a signal state LVT_DIS, which when asserted or set (e.g., LVT_DIS=1) causes PSW_CTRL to control the supply switch 114SW to disconnect the LVT power supply 114PS from, and thereby disable, the LVT DOMAIN 114, and conversely when de-asserted or cleared (e.g., LVT_DIS=0) causes PSW_CTRL to control the supply switch 114SW to couple the LVT power supply 114PS to, and thereby enable, the LVT DOMAIN 114. LVT_DIS can be implemented as a register bit, a state machine signal, or the like. The LVT_DIS state can be set (to disable the LVT DOMAIN 114) by software writing directly to it, while its state can be cleared (to enable the LVT DOMAIN 114) either in response to hardware, namely an assertion of THRESH- OLD, or again by software, but by proxy to another intermediary storage (not expressly shown) outside the LVT DOMAIN 114, where the proxy then correspondingly asserts a software override signal, SW_OR to clear LVT_DIS. Lastly, an LVT RX control logic block 132 is also associated with the RX path 104, but is within the LVT DOMAIN 112 and is for controlling certain operations in connection with the LVT RX FIFO 128, for example in managing pointers for writing to, and reading from, the LVT RX FIFO 128.

The TX section 106 includes various aspects for transmitting the TX DATA OUT data sequence. Looking from left to right FIG. 1, an output from the block of registers 108 is coupled to an input of a TX FIFO 134. The TX FIFO 134 includes a plural number of same sized storage locations, again with the example that each is an M-bit storage. Data is written to, and then successively output from, the TX FIFO 134 generally in a FIFO manner, and per pointers not expressly shown, for example pointing to the newest and oldest data locations in the TX FIFO 134. The output of the TX FIFO 134 is coupled to an input of a TX SR 136. The TX SR 136 operates to shift data, for example one bit at a time, from an indicated storage location in the TX FIFO 134, and cumulatively as a serial data stream forming the TX DATA OUT and thereby providing a serial output port from the SCM 100. A TX control logic block 138 is associated with the TX section 106, and it controls operations in connection with the TX FIFO 134. Further, because the TX section 106 is within the LVT DOMAIN 114, and as introduced above power may be selectively enabled and disabled to that domain, then the TX control logic block 138, or other aspects provided in hardware and software, also are provided to ensure that the LVT DOMAIN 114 is enabled to commence, perform, and complete TX operations, as described later.

Figure 2:
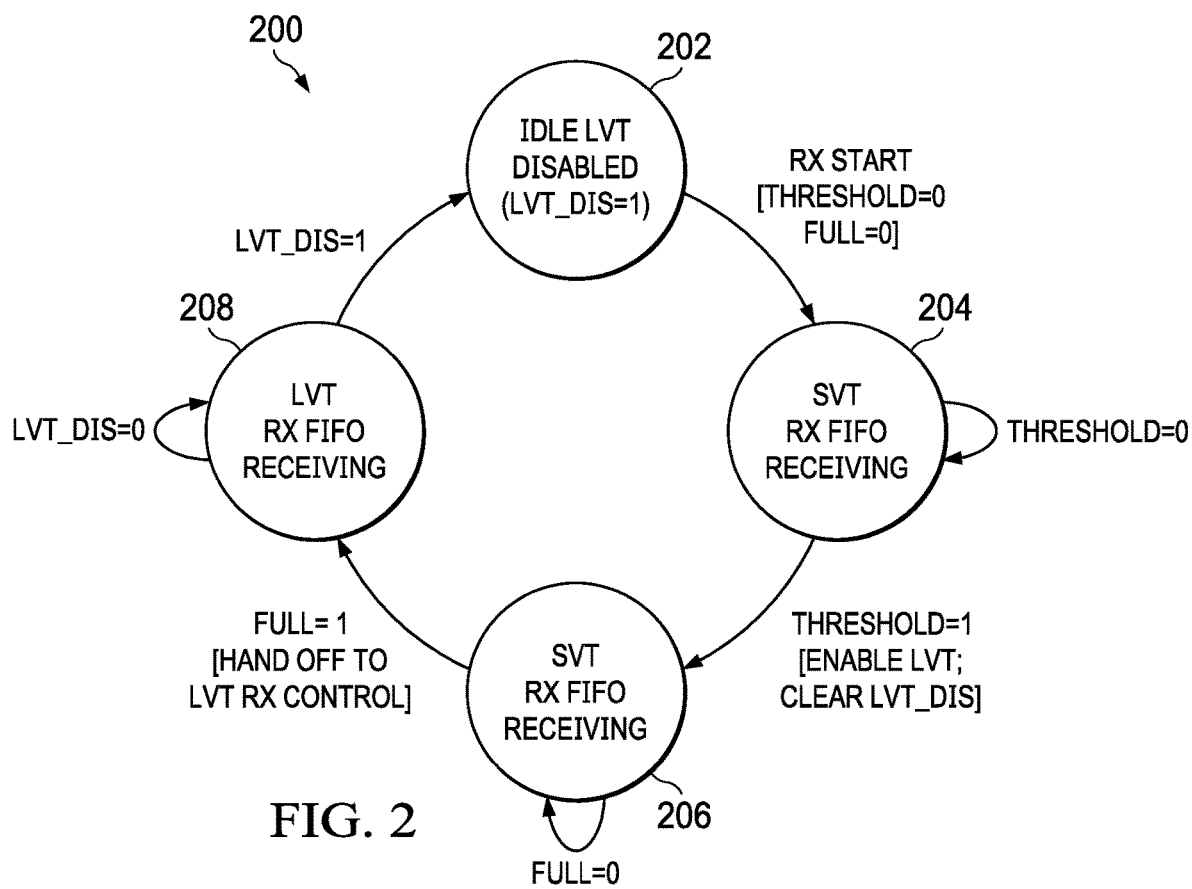
FIG. 2 is a state diagram of certain receive related operations of the FIG. 1 SCM.

FIG. 2 is a state diagram 200 of certain RX related operations of the SCM 100. The states, transitions, and actions of the state diagram 200 may be implemented primarily or solely by hardware, for example in part or whole in one or both of the SVT RX and LVT RX control logic blocks 130 and 132 or a separate controlling finite state machine (FSM), and further in combination with steps taken by a CPU or DMA controller, for example via the first and second busses 111a and 111b.

Reference is to a first state 202 in the state diagram 200. In the first state 202, the RX function of the SCM 100 is idle, as no RX DATA IN is being received by the SCM 100 and no data is stored in the logical FIFO, including both the SVT RX FIFO 126 and the LVT RX FIFO 128. As a result of the empty SVT RX FIFO 126, both of the above-introduced control values of THRESHOLD and FULL, both describing levels of valid data stored in the SVT RX FIFO 126, are de-asserted (e.g., THRESHOLD=0; FULL=0), for example by pointer-related hardware associated with the SVT RX FIFO 126. Further, the LVT DOMAIN 114 is disabled, for example by an earlier assertion of LVT_DIS (e.g., LVT_DIS=1). Such an assertion may occur, for example, by software writing to assert LVT_DIS in FIG. 1, thereby resulting in the disabling of the LVT DOMAIN 114. Disabling the LVT DOMAIN 114 saves power, for example when no RX DATA IN is being received. Further, in FIG. 1, when LVT_DIS is asserted, the SVT RX control logic block 130 responds by asserting PSW_CTRL to a state that opens the supply switch 114SW, which in turn disconnects power from any device within the LVT DOMAIN 114. Thereafter, the SCM 100 RX operations remain in the first state 202, until RX DATA IN is received by the RX SR 118, as will occur at the beginning of a data communication session from a separate device, communicating such DATA, to the SCM 100. In response to initial receipt of the RX DATA IN, the state diagram 200 transitions from the first state 202 to a second state 204.

In the second state 204, the LVT DOMAIN 114 (and the LVT RX FIFO 128 in it) remains disabled, the RX DATA IN from the RX SR 118 is coupled to the SVT RX FIFO 126, and thereafter the SVT RX FIFO 126 receives data until the next state transition. In the FIG. 1 example, this data coupling is achieved through the data switch 120 and the first terminal 122. Specifically, because THRESHOLD=0, the SVT RX control logic block 130 responds by outputting DSW_CTRL to a state that causes the data switch 120 to connect its pole to the first terminal 122, thereby providing a data path from the RX SR 118 to the SVT RX FIFO 126. The clock rate for data received into the SVT RX FIFO 126 may be specified (or constrained) based on the technology that implements the FIFO; for example, if relatively larger and slower transistors implement the SVT RX FIFO 126 (in order to reduce relative leakage), then the second state 204 clock rate may be in a first range, such as from 12 MHz to 24 MHz. Further, once in the second state 204 and as additional RX DATA IN is received, that data continues along the data path from the RX SR 118 to the SVT RX FIFO 126, so long as the amount of valid data in the SVT RX FIFO 126 is sufficiently low so as to not change the state of THRESHOLD. For example, if the SVT RX FIFO 126 has four storage locations, then THRESHOLD may remain de-asserted so long as a threshold of 75% (three locations) or less of those storage locations contain valid M-bit data quantities, collectively received during a data session from serial data input as RX DATA IN. Once the storage threshold of the SVT RX FIFO 126 is met, again in the present example when three FIFO storage locations contain valid data, then THRESHOLD is asserted (e.g., THRESHOLD=1) and, in response, the state diagram 200 transitions from the second state 204 to a third state 206. In connection with the transition to the third state 206, the complement of THRESHOLD de-asserts (clears) LVT_DIS and thereby enables the LVT DOMAIN 114, which may occur in FIG. 1, for example, by the SVT RX control logic block 130 responding to the change in THRESHOLD and LVT_DIS by asserting PSW_CTRL, thereby closing the power switch 114SW, which in turn provides power to any device within the LVT DOMAIN 114.

In the third state 206, the data switch 120 continues to couple RX DATA IN from the RX SR 118 to the SVT RX FIFO 126, after its threshold has been reached, but so long as the SVT RX FIFO 126 is not entirely full of valid data. Accordingly, from the prior states and transitions, the SVT RX FIFO 126 started to fill when the LVT DOMAIN 114 was disabled and any leakage that otherwise would occur in that domain was correspondingly avoided, and once the SVT RX FIFO 126 threshold was reached, the SVT RX FIFO 126 continued to fill while at that point the LVT DOMAIN 114 was enabled, thereby readying any device in that domain for operation. The third state 206, of the SVT RX FIFO 126 continuing to fill, occurs until the SVT RX FIFO 126 stores a second amount of valid data greater than the amount represented by THRESHOLD, so the second amount may be a specified amount greater than THRESHOLD but less than entirely filled, or in the illustrated example occurs when the SVT FIFO 126 is entirely full, at which point the state diagram 200 transitions from the third state 206 to a fourth state 208. In FIG. 1, this transition is implemented when FULL transitions to FULL=1, which is signaled to the SVT RX control logic block 130. In response, the SVT RX control logic 130 transitions the state of DSW_CTRL so that the data switch 120 connects its pole to the second terminal 124, thereby providing a data path from the RX SR 118 to the LVT RX FIFO 128. Also in response to FULL=1, the SVT RX control logic 130 hands off control to the LVT RX control logic block 132.

In the fourth state 208, with the data switch 120 having been switched to the second terminal 124, received data is coupled from RX DATA IN, to the RX SR 118, to the LVT RX FIFO 128, so the LVT RX FIFO 128 receives data into its M-bit locations 128SL. The clock rate for data received into the LVT RX FIFO 128 may be specified based on the technology that implements the FIFO. For example, if relatively smaller and faster transistors implement the LVT RX FIFO 128 in order to increase speed performance, then the rate may be in a second range above 24 MHz, and from 80 MHz to 120 MHz. Further, the SVT RX control logic 130 may include a mechanism to control or otherwise implement the rate selected from the second range for the LVT RX FIFO 128, the rate selected from the above-introduced first range for the SVT RX FIFO 126, and the transition between those two rates as data receipt switches from the SVT RX FIFO 126 to the LVT RX FIFO 128. Meanwhile, the logical FIFO, including the SVT RX FIFO 126 and the LVT RX FIFO 128, has an associated DATA RX register with a state, DATA_RX, that once asserted indicates data is ready to be transmitted out from the logical FIFO. For example, hardware in either of the SVT RX and LVT RX control blocks 130 and 132 can determine the level of logical FIFO data fullness, for example with reference to the start pointer of the SVT RX FIFO 126 and the end pointer of the LVT RX FIFO 128, and assert DATA_RX (e.g., DATA_RX=1) when the data fullness level reaches a limit, where the limit may be fixed or software configurable. Accordingly, software can read the DATA_RX state and generate a trigger, interrupt, or the like, so that once DATA_RX=1, either the CPU or DMA operates to remove data first from the SVT RX FIFO 126, and this process continues while the current session of RX DATA continues. Once that RX DATA communication session completes, the CPU/DMA may continue to read data from the logical FIFO, thereby emptying first the SVT RX FIFO 126 followed by emptying the LVT RX FIFO 128, until the entire logical FIFO is empty. Once the FIFO empty status is achieved, as can be inferred from the logical FIFO pointers (and for example by de-asserting DATA_RX), the software changes the state of LVT_DIS to LVT_DIS=1. In response, the SVT RX control logic block 130 transitions the state diagram 200 from the fourth state 208 back to the first state 202, thereby disabling the LVT DOMAIN 114 and during which there is no data receipt by the LVT RX FIFO 128. These aspects can be realized in FIG. 1 by setting PSW_CTRL to return the supply switch 114SW to the above-described open position so as to disconnect the LVT power supply 114PS from all devices in the LVT DOMAIN 114, by asserting DSW_CTRL to the data switch 120 to disconnect the path to the LVT RX FIFO 128, and by resuming FIFO control to the SVT RX control logic block 130 (and correspondingly discontinuing such control, and as noted the power supply to, the LVT RX control logic block 132).

The above demonstrates that the SCM 100 includes a single logical FIFO comprising two different physical portions, each in a different respective power DOMAIN 112 and 114. Accordingly, one portion of that FIFO (the LVT RX FIFO 128), which may be the majority of the FIFO storage locations, can be disabled either when no external RX DATA IN is received or during an initial receipt of such RX DATA into the other portion (the SVT RX FIFO 126) of the logical FIFO. Such an approach can have considerable benefit, particularly for an asynchronous receiver, as the receiver is not informed of when data will arrive, so the example SCM 100 can maintain a portion of its FIFO in a no-power mode during the entire time when no data is being received. These benefits also extend into an initial portion of a RX data communication session, as the lower-leakage portion of the logical FIFO (the SVT RX FIFO 126) continues to receive data, while the higher-leakage portion remains disabled. Accordingly, both before data is received and during a portion of the receipt, the SVT RX FIFO 126 can operate and avail of the benefits of the SVT DOMAIN 112, while at that same time the LVT RX FIFO 128 is disabled, thereby avoiding the potential power consumption (leakage) that otherwise could occur where the LVT RX FIFO 128 enabled at that time. Once the SVT RX FIFO 126 reaches a THRESHOLD level of fullness, the LVT RX FIFO 128 is dynamically readied to begin accepting data, and it subsequently receives such data once the SVT RX FIFO 126 is full. During those subsequent operations, the faster-operating LVT RX FIFO 128 receives the data and also is subsequently read to transfer that data under control of some master (e.g., CPU or DMA). The sizing of the SVT RX FIFO 126 relative to the LVT RX FIFO 128 may be adjusted based on design considerations, for example keeping the SVT RX FIFO 126 relatively small compared to the LVT RX FIFO 128, so as to save cost, but while also allowing ample size to the SVT RX FIFO 126 to receive data while the LVT RX FIFO 128 is turned off. For example, assume a clock rate of 12 Mbps during an asynchronous receive period, during which an M=16 bits of serial data are received, thereby taking 1.33 μsec and filling one M-bit storage location in the SVT RX FIFO 126. Assume further that the THRESHOLD signal can change and the SVT RX control logic block 130 can respond thereto by changing the power switch 114SW in 1.0 μsec. With these assumptions, then ideally it would be possible to include only a single M-bit storage location in the SVT RX FIFO 126, with any remaining needed storage locations implemented in the LVT RX FIFO 128. As another consideration, however, the number of storage locations 126SL in the SVT RX FIFO 126 could be increased, for example in contemplation of asynchronous and intermittent data reception scenarios, in which case it may be desired to further delay the time before the LVT RX FIFO 128 is powered, and to accommodate that delay, additional storage locations 126SL are implemented into the SVT RX FIFO 126, for example increasing the above example of one storage location to four storage locations. In contrast, the LVT RX FIFO 128 may have a number of storage locations 128SL such as 32, 48, or 64, depending on the maximum communication speed supported. Further, the amount of fullness of the SVT RX FIFO 126 corresponding to the change in THRESHOLD state, and thereby enabling the LVT DOMAIN 114, may be adjusted, either by design specification or, as indicated earlier, by software configuration. The THRESHOLD state change point can be determined with consideration to the amount of time needed to power up the LVT domain 114, while the SVT RX FIFO 126 continues its storage fill from its threshold-satisfied level to its full level.

Completing the FIG. 2 discussion, the LVT DOMAIN 114 also includes the above-introduced blocks in the TX section 106. In the sense of transmitting from a FIFO, these blocks complete the transceiver capability of the SCM 100, that is, providing a complementary transmit function along with the receive function that is speared into both the SVT DOMAIN 112 and the LVT DOMAIN 114. Accordingly, the TX FIFO 134, the TX control logic block 138, and the TX SR 136 may be implemented by person of skill in the art, given various considerations either for an SCM in general, or in combination with attributes that arise from the hybrid SVT/LVT of the structure. In all events, the TX section 106 permits data communicated to the first and second busses 111a and 111b to be stored as parallel data into the TX FIFO 134 and serialized out as the TX DATA OUT by the TX SR 136. In addition, however, the TX section 106 is in the LVT DOMAIN 114, which as has been described, may be selectively enabled and disabled. Accordingly, the example SCM 100 further implements sufficient accommodation so that the TX section 106 can transmit when desired, without being prohibited due to power-savings circuitry and functionality associated with the RX section 104. For example, if the LVT DOMAIN 114 is disabled from power (LVT_DIS asserted), for example when no RX DATA IN is received or when the SVT RX FIFO 126 is receiving data, but a TX function is desired (e.g., from the CPU or DMA), software can clear LVT_DIS so as to provide power to the LVT DOMAIN 114. For example in FIG. 1, when the LVT DOMAIN 114 is disabled, note that the bus I/F 110 and path beyond it are powered down within the LVT DOMAIN 114; accordingly, an intermediary storage (not expressly shown) is provided outside the LVT DOMAIN 114, to which the software can assert SW_OR even when the LVT DOMAIN 114 is powered down, and that SW_OR assertion is coupled as shown in FIG. 1 to clear LVT_DIS, that is, the asserted SW_OR overrides the LVT DOMAIN 114 disabling indication of LVT_DIS=1, changing it to an LVT DOMAIN 114 enabling value of LVT_DIS=0. This change causes the SVT RX control logic block 130 to close the supply switch 114SW and enable power to the LVT DOMAIN 114. With the LVT DOMAIN 114 thus powered, the TX operations can proceed as known in the art. Once those TX operations are complete, and with the LVT DOMAIN 114 having been powered to accomplish them, the software can directly set LVT_DIS and thereby cause the LVT power to disconnect from the LVT DOMAIN 114.

Figure 3:
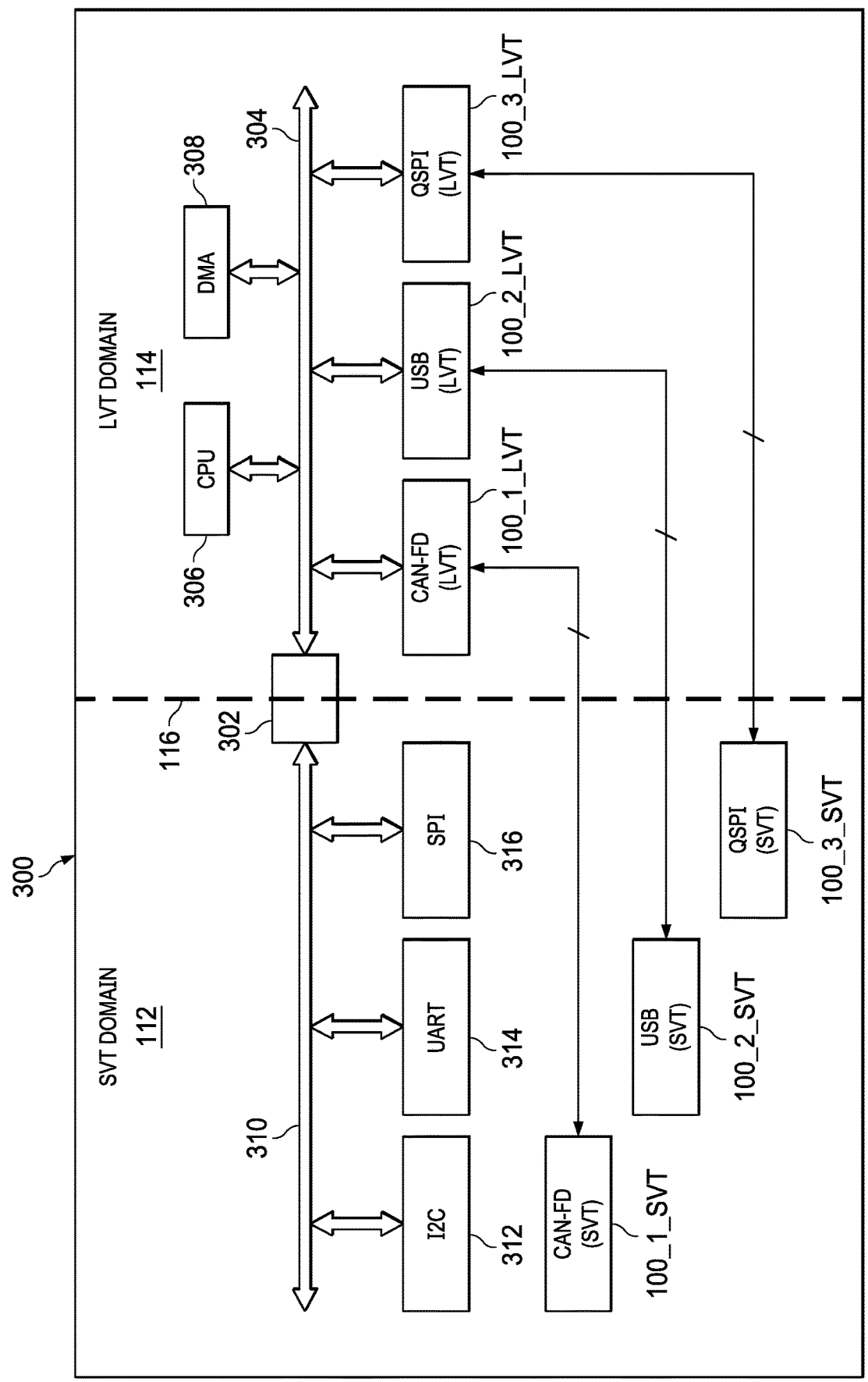
FIG. 3 is an example of a system on a chip that implements various of the aspects illustrated in FIGS. 1 and 3 within plural different SCMs.

FIG. 3 is an example of an SoC 300 that implements various of the aspects described above, in combination with plural SCMs. The SoC includes the SVT DOMAIN 112 and the LVT DOMAIN 114, separated generally by a (vertical dashed) domain dividing line 116. Accordingly, blocks to the left of the domain dividing line 116 are constructed using technologies, and are for operating, within a relatively low power environment, while blocks to the right of the domain dividing line 116 are constructed using technologies, and are for operating, within a relatively high power environment. Lastly, an asynchronous bridge 302 spans the SVT DOMAIN 112 and the LVT DOMAIN 114, implementing both SVT and LVT devices and appropriate architecture, as may be determined by a person of skill in the art, to permit communication between SVT and LVT devices.

The LVT DOMAIN 114 includes a first bus 304 coupled to a CPU 306 and a DMA controller 308. The LVT DOMAIN 114 further includes a portion of three different SCMs, each also coupled to the first bus 304 and constructed to include both an LVT portion and an SVT portion, where the first bus 304 is coupled to the LVT portion. Specifically, the first bus 304 is coupled to a first SCM LVT portion 100_1_LVT, for example of a CAN-FD module, and to a second SCM LVT portion 100_2_LVT, for example of a USB module, and to a third SCM LVT portion 100_3_LVT, for example of a QSPI module. Each of the LVT portions 100_1_LVT, 100_2_LVT, and 100_3_LVT, illustrates an SCM constructed according to the general and LVT-related principles of FIG. 1 and to operate per FIG. 2.

The SVT DOMAIN 112 includes a second bus 310. The second bus 310 is coupled to plural SVT modules, namely, a fourth SCM 312, for example implementing an I2C module, a fifth SCM 314, for example implementing a UART module, and a sixth SCM 316, for example implementing SPI. Each of the fourth SCM 312, the fifth SCM 314, and the sixth SCM 316, may be constructed and operate according to principles known in the art, so as to perform the respective functionality/protocol in a relatively low power domain environment. The SVT DOMAIN 112 also includes an SVT portion for each of the three SCMs that have a respective LVT portion in the LVT DOMAIN 114, namely, a first SCM SVT portion 100_1_SVT of the CAN-FD module, a second SCM SVT portion 100_2_SVT of the USB module, and a third SCM SVT portion 100_3_SVT of the QSPI module. Each of the SVT portions 100_1_SVT, 100_2_SVT, and 100_3_SVT, illustrates an SCM constructed according to the general and SVT-related principles of FIG. 1 and is coupled to a respective LVT portion 100_1_LVT, 100_2_LVT, and 100_3_LVT, and to operate per FIG. 2.

The SoC 300 may operate as known or ascertainable by person of skill in the art, with respect to the CPU 306, the DMA 308, and the first and second busses 304 and 310. Additionally, communications to and from the SVT DOMAIN 112 SCMs 312, 314, and 316 are per each of those devices. With respect to each of the remaining modules, each such module follows the FIG. 2 state diagram 200, so that when idle the respective module has power to its respective SVT portion, while power is disabled to its respective LVT portion, and with a relatively small SVT RX FIFO ready to receive data (e.g., asynchronous data). The relatively small SVT RX FIFO subsequently receives such data when it arrives to the module (via a separate respective interface, not shown). As the relatively small SVT RX FIFO in any of those remaining modules fills to its threshold, then its corresponding LVT portion is enabled and readied to receive additional data in a larger LVT RX FIFO, once the smaller SVT RX FIFO is filled. Accordingly, the benefits achieved for the singular SCM 100 described in FIG. 2 are scaled upward in the SoC 300 of FIG. 3.

From the above, described examples provide electronic circuitry with one or more communication modules implementing mixed threshold voltage transistors. The mixed-threshold-voltage circuitry includes a data communication structure, such as a memory (FIFO), in which a first portion of the structure remains enabled during periods when no data is received (as may be common in an asynchronous transceiver) while a second portion, for example larger than the first portion, receives little or no power as the first portion is able to receive a first portion of a communicated data stream. Further, the first and second portions are constructed using differing technologies, for example different sized/speed/leakage level transistors. When a communicated data stream is received, the first portion initially receives data, and at some point during that initial receipt the second portion is provided power and is able to receive a second portion of the communicated data stream. With one or more of these aspects, a considerable amount of power may be saved, as compared to a communication module implementing relatively fast, but small sized and high leakage devices. For example, in comparing a serial communications module with an always-on LVT implemented FIFO to the example of FIG. 1, it is anticipated that a reduction of over 100 times in power may be saved, given the amount of time the LVT portion of the FIG. 1 is disabled and its size relative to the always-on SVT portion. Meanwhile, the cost increase of mixing both LVT and SVT devices, to implement the FIG. 1 (or FIG. 3) approach, is relatively minimal. Accordingly, the examples provide a hybrid LVT and SVT structure with benefits over the prior art, and that may be realized in the potentially diverging specifications for an SoC where both leakage and speed performance are increasing. As another benefit, additional modifications are possible in the described embodiments, and other embodiments are possible, within the scope of the following claims.

What is claimed is:

1. A communications circuit comprising:
   an input port;
   a switching circuit coupled to the input port;
   a first memory coupled to the switching circuit and configured to output a control signal;
   a second memory coupled to the switching circuit; and
   controlling circuitry configured to receive the control signal and control the switching circuit to couple the input port to the first memory to receive data from the input port while the second memory is decoupled from power based on the control signal, and to couple the input port to the second memory receive data from the input port based on the control signal indicating that the first memory stores a predetermined amount of valid data.

2. The communications circuit of claim 1 wherein the predetermined amount of valid data is once the first memory is filled with valid data.

3. The communications circuit of claim 1:
   wherein the first memory includes transistors operating at a first frequency; and
   wherein the second memory includes transistors operating at a second frequency higher than the first frequency.

4. The communications circuit of claim 1:
   wherein the first memory includes transistors operable to leak a first amount of current when enabled with power; and
   wherein the second memory includes transistors operable to leak a second amount of current, greater than the first amount of current, when enabled with power.

5. The communications circuit of claim 1 and further including a power switching circuit coupled to the second memory, the power switching circuit responsive to a power control signal output by the controlling circuitry.

6. The communications circuit of claim 5:
   wherein the predetermined amount of data is a first predetermined amount of data; and
   wherein the power switching circuit is configured to couple the power supply to the second memory once the first memory stores a second predetermined amount of valid data less than the first predetermined amount of data.

7. The communications circuit of claim 1:
   wherein the first memory includes a first number of storage locations; and
   wherein the second memory includes a second number, greater than the first number, of storage locations.

8. The communications circuit of claim 7 wherein each of the storage locations in the first memory and in the second memory are configured to store a same number of bits.

9. The communications circuit of claim 1 wherein the data received at the input port is serial data.

10. The communications circuit of claim 1 and further including a serial register coupled between the input port and the switching circuit.

11. The communications circuit of claim 1 wherein the first memory and the second memory combine to form a logical first in first out memory.

12. A method of operating a communications device, the method comprising:
   receiving a data sequence at an input port;
   for a first portion of the data sequence, coupling the input port to a first memory of the communications device while disabling power from a second memory of the communications device based on a control signal being in a first state, the control signal output from the first memory; and
   for a second portion of the data sequence, coupling the input port to the second memory while enabling power to the second memory in response to the control signal being in a second state.

13. The method of claim 12 and further including enabling power to the second memory when the first portion fills a threshold level of storage in the first memory.

14. The method of claim 12 further including coupling the second portion to the second memory after the first memory is filled with valid data.

15. The method of claim 12 wherein the first memory and the second memory form a FIFO memory.

* * * * *